United States Patent
Helmut et al.

(10) Patent No.: US 12,235,307 B2
(45) Date of Patent: Feb. 25, 2025

(54) APPARATUS AND METHOD FOR DETERMINING A RESPONSE OF A DEVICE UNDER TEST TO AN ELECTRICAL PULSE GENERATED BY A PULSE GENERATOR

(71) Applicants: UNIVERSITÄT DER BUNDESWEHR MÜNCHEN, Neubiberg (DE); TECHNISCHE UNIVERSITÄT MÜNCHEN, Munich (DE)

(72) Inventors: Dennis Helmut, Munich (DE); Gerhard Groos, Munich (DE)

(73) Assignees: UNIVERSITAT DER BUNDESWEHR MÜNCHEN, Neubiberg (DE); TECHNISCHE UNIVERSITÄT MÜNCHEN, Munich (DE)

( * ) Notice: Subject to any disclaimer, the term of this patent is extended or adjusted under 35 U.S.C. 154(b) by 106 days.

(21) Appl. No.: 18/246,859

(22) PCT Filed: Oct. 6, 2021

(86) PCT No.: PCT/EP2021/077525
§ 371 (c)(1),
(2) Date: Mar. 28, 2023

(87) PCT Pub. No.: WO2022/074042
PCT Pub. Date: Apr. 14, 2022

(65) Prior Publication Data
US 2024/0019480 A1    Jan. 18, 2024

(30) Foreign Application Priority Data
Oct. 9, 2020  (EP) .................................... 20201004

(51) Int. Cl.
*G01R 31/00* (2006.01)

(52) U.S. Cl.
CPC .................................. *G01R 31/002* (2013.01)

(58) Field of Classification Search
None
See application file for complete search history.

(56) References Cited

U.S. PATENT DOCUMENTS

| | | |
|---|---|---|
| 6,429,674 B1 | 8/2002 | Barth et al. |
| 7,545,152 B2 | 6/2009 | Grund |
| 2007/0159186 A1* | 7/2007 | Grund ................ G01R 31/2822 324/678 |

OTHER PUBLICATIONS

Evan Grund et al: "Obtaining TLP-like information from an HBM simulator", 29th Electrical Overstress/Electrostatic Discharge Symposium (EOS/ESD), 2007. EOS/ESD, IEEE, PI, Sep. 1, 2007 (Sep. 1, 2007), pp. 2A.3-1.

(Continued)

*Primary Examiner* — Farhana A Hoque
(74) *Attorney, Agent, or Firm* — Buchanan Ingersoll & Rooney PC

(57) ABSTRACT

An apparatus for determining a response of a device under test to an electrical pulse generated by a pulse generator. The apparatus can include a conductor for coupling the electrical pulse generator to the device under test and at least two sensing probes connected to the conductor. Each of the at least two sensing probes can be positioned at one of at least two measurement points and can be configured to generate a signal in direct proportion to a current flowing in or a voltage applied to the conductor at the corresponding measurement point. A determination device can be configured to determine the response of the device under test to the electrical pulse based on the signals generated by the at least two sensing probes nd the transit times of the electrical pulse between these different measurement points.

18 Claims, 6 Drawing Sheets

(56) References Cited

OTHER PUBLICATIONS

Evan Grund et al: "VF-TLP systems using TDT and TDRT for kelvin wafer measurements and package level testing", Electrical Overstress/Electrostatic Discharge Symposium, 2004. EOS/ESD '04, IEEE, Piscataway, NJ, USA, Sep. 19, 2004 (Sep. 19, 2004), pp. 1-8.
Gieser H et al: "Very-fast transmission line pulsing of integrated structures and the charged device model", Electrical Overstress / Electrostatic Discharge Symposium Proceeding, XX, XX, Sep. 10, 1996 (Sep. 10, 1996), pp. 85-94.
Patrick A Juliano et al: "Accurate Wafer-Level Measurement of ESD Protection Device Turn-On Using a Modified Very Fast Transmission-Line Pulse System", IEEE Transactions on Device and Materials Reliability, IEEE Service Center, Piscataway, NJ, US, vol. 1, No. 2, Jun. 1, 2001 (Jun. 1, 2001).
International Search Report for PCT/EP2021/077525 dated Jan. 20, 2022.
Written Opinion of the International Searching Authority for PCT/EP2021/077525 dated Jan. 20, 2022.
Extended European Search Report for PCT/EP2021/077525 dated Mar. 19, 2021.
Horst A. Gieser, et al.: "Survey on Very Fast TLP and Ultra Fast Repetitive Pulsing for Characterization in the CDM-Domain" IEEE 07CH37867 45th Annual International Reliability Physics Symposium, Phoenix, 2007.

* cited by examiner $U_{DUT} = U_h + U_r$ $Z_0 * \cdot I_{DUT} = U_h - U_r$

APPARATUS AND METHOD FOR DETERMINING A RESPONSE OF A DEVICE UNDER TEST TO AN ELECTRICAL PULSE GENERATED BY A PULSE GENERATOR

CROSS-REFERENCE TO RELATED APPLICATIONS

This application is the U.S. national stage application of International Patent Application No. PCT/EP2021/077525, filed on Oct. 9, 2021, which claims priority to European Patent Application No. EP 20201004.7, filed on Oct. 9, 2020.

FIELD

The present application relates to an apparatus and a method for determining a response of a device under test to an electrical pulse generated by a pulse generator, wherein the pulse can have an arbitrarily long pulse duration, and wherein at the same time a high time resolution can be achieved.

BACKGROUND

It is useful to measure the ways integrated circuits respond to electrical pulses when evaluating their electrostatic discharge ("ESD") protection. Electrostatic discharge has long been recognized as a threat to integrated circuit devices. Whether generated through triboelectrification, induction or conduction, the discharge that occurs can contain several hundred nano-joules of energy and generate 3.000 V, enough to destroy all but the most robust semiconductor devices.

SUMMARY

Measurement of integrated circuit pulse response is often made using Transmission Line Pulse (TLP) techniques. These techniques are designed to measure the ways integrated circuits respond to current and voltage pulses that are delivered to them by a TLP pulse generator. The TLP pulse generator delivers an initial, or incident TLP pulse through a constant impedance cable to a selected terminal of an integrated circuit or other device under test. When the incident TLP pulse reaches the device under test, it is partly reflected by the device under test and new current and voltage pulse waveforms result. The reflected pulse overlaps with the incident pulse as it travels back up the constant impedance cable in the opposite direction, toward the TLP pulse generator. The constant impedance cable is designed in a manner known in the art to avoid significant pulse distortions, so that the reflected pulse may be accurately measured and the dynamic impedance of the device under test may be calculated by comparing the ratio of the incident and the reflected pulse.

Therein, typically current and/or voltage oscilloscope probes are used to measure the incident and the reflected current and/or voltage pulse waveforms. These probes are positioned in the constant impedance cable at a selected insertion point where the incident and the reflected pulses are expected to overlap. However, there is always a time delay between the incident and the reflected pulses when there is any length of cable between an oscilloscope probe and the device under test, wherein these delays usually cause measurement errors. Therefore, in known TLP techniques, the oscilloscope probes and the device under test are usually positioned close to each other, in order to avoid these measurements errors as much as possible. Therefore, although comparatively long pulses can be used, the time resolution that can be achieved is limited, wherein, however, in order to accurately determine the capacitive and inductive features of a device, it is necessary to determine the voltage and the current at the device with high time resolution.

Therefore, techniques with TLP pulse widths of less than 10 nanoseconds have been developed, which are commonly termed Very Fast TLP or VF-TLP. In Very Fast TLP systems usually a single voltage sensor is positioned between a pulse generator and a device under test in such a way, that the incident and reflected pulses can be separately recorded by the voltage sensor in terms of time, whereby the time resolution when determining the voltage and the current at the device can be significantly improved. However, for example due to cable loss, only a constant impedance cable of limited length, and therefore, only very short pulses can be used in Very Fast TLP systems.

The document of U.S. Pat. No. 7,545,152 B2 discloses a Transmission Line Pulse measurement system for testing devices such as integrated circuits, and especially for testing the electrostatic discharge protection structures connected to terminals on such integrated circuits. The Transmission Line Pulse measurement system measures the pulsed voltage and/or current of a device under test by recording voltage and/or current pulse waveforms traveling in a constant impedance cable to and from the device under test. The pulses going to and returning from the device under test are processed to create signal replicas of the voltage and current pulses that actually occurred at the device under test. Oscilloscope operating settings optimize the recording of these signal replicas by improving the measurement signal-to-noise ratio. This improved Transmission Line Pulse system is especially useful when very short width pulses on the order of less than 10 nanoseconds are used to test the response of the device under test.

It is an object of the present invention to provide an improved apparatus and an improved method for determining a response of a device under test to an electrical pulse generated by a pulse generator, wherein the pulse can have an arbitrarily long pulse duration, and wherein at the same time a high time resolution can be achieved.

According to one embodiment of the invention, this object is solved by an apparatus for determining a response of a device under test to an electrical pulse generated by a pulse generator, wherein the apparatus comprises a conductor for coupling the electrical pulse generator to the device under test, wherein the conductor has a predetermined electrical impedance and a predetermined pulse propagation velocity, at least two sensing probes connected to the conductor, wherein each of the at least two sensing probes is positioned at one of at least two measurement points on the conductor and is configured to generate a signal in direct proportion to a current or a voltage applied to the conductor at the corresponding measurement point, and a determination means for determining the response of the device under test to the electrical pulse based on the signals generated by the at least two sensing probes. Therein, at least two of the at least two sensing probes are positioned at different measurement points of the at least two measurement points, wherein a distance between two of these different measurement points on the conductor is respectively defined in such a way, that a transit time of the electrical pulse between these two different measurement points can be determined, for example determined by the determination means, wherein the determination means is configured to determine the response of the device under test based on the signals generated by the at least two sensing probes and the transit times of the electrical pulse between these different measurement points.

Therein, preferably the electrical impedance of the conductor is constant over the entire length of the conductor. Further, that the conductor has a predetermined pulse propagation velocity means that the pulse propagation velocity of the conductor is known, wherein preferably the pulse propagation velocity is constant over the entire length of the conductor.

Thereby, an improved apparatus for determining a response of a device under test to an electrical pulse generated by a pulse generator is provided, wherein the pulse can have an arbitrarily long pulse duration, and wherein at the same time a high time resolution can be achieved. In particular, as at least two of the at least two sensing probes are positioned at different measurement points of the at least two measurement points, the incident and reflected pulses do not have to be recorded well-separated in terms of time, wherefore compared to known Very Fast TLP systems a shorter conductor can be used and the electrical pulse can have a comparatively long pulse duration. Further, due to the fact that distances between these different measurement points on the conductor are defined in such a way, that transit times of the electrical pulse between these different measurement points can respectively be determined, for example by the determination means, wherein the determination means is configured to determine the response of the device under test based on the signals generated by the at least two sensing probes and the transit times of the electrical pulse between these different measurement points, the signal transients are different at the at least two measurement points, wherefore they can be used to determine the response of the device under test, wherefore, compared to known TLP systems, the voltage and the current at the device can be determined with high time resolution. Therefore, an apparatus is provided that combines the advantages of both, a common TLP system and a common Very Fast TLP system.

Here, that transit times of the electrical pulse between the different measurement points can be determined means that the distance between respectively two, in particular two successive measurements is selected in such a way, that the distance is at least as large that a transit time of the pulse between these successive measurement points can be determined based on the resolution of the used measurement means, respectively of the used sensing probes and the used determination means. Thus, the measured signal transients are different at the at least two measurement points, wherefore the difference between the signal transients measured at the at least two measurement points can be used to determine the response of the device under test with a high temporal resolution. Therein, the transit times can for example be determined respectively acquired by the sensing probes and the determination means itself. Further, for example also time stamps may be added to the signals generated by the corresponding sensing probes, wherein the transit times are determined based on the time stamps. On the other hand, the test arrangement, and therefore, also the transit times between these different measurement points may already be known, wherein the corresponding transit times can for example be stored in a look-up table, and wherein the transit times can be determined based on the look-up table.

Therein, each of the at least two sensing probes is configured to generate a signal in direct proportion to the voltage applied to the conductor at the corresponding measurement point. This has the advantage that the time resolution when determining the response of the device under test can be further improved, as voltage sensors usually achieve a higher time resolution than current sensors. However, that each of the at least two sensing probes is configured to generate a signal in direct proportion to the voltage applied to the conductor at the corresponding measurement point should merely be understood as an example and at least some of the at least two sensing probes or each of the at least two sensing probes may be configured to generate a signal in direct proportion to the current flowing in the conductor at the corresponding measurement point, too.

Further, in one embodiment each of the at least two sensing probes is positioned at a separate measurement point, wherein a distance between two successive measurement points is respectively defined in such a way, that a transit time of the electrical pulse between the corresponding successive measurement points can be determined, for example by the determination means, and wherein a distance between a last measurement point and the device under test is defined in such a way, that a transit time of the electrical pulse between the last measurement point and the device under test can be determined, for example by the determination means, and wherein the determination means is configured to determine the response of the device under test based on the signals generated by the at least two sensing probes, the respective transit times of the electrical pulse between successive measurement points, and the transit time of the electrical pulse between the last measurement point and the device under test. Therein, the last measurement is the measurement closest to the device under test. This embodiment has the advantage that the reliability and accuracy in the determination of response of the device under test can be further improved.

Furthermore, the determination means or determination device can be configured to determine a change of a voltage generated at the device under test in response to the electrical pulse over time and/or a change of a current generated at the device under test in response to the electrical pulse over time. Like known TLP systems, also the described apparatus can be used to produce current/voltage curves in which each data point is from an electrical pulse whose duration and current amplitude are in the same range as system level electrostatic discharge events. These current/voltage curves, and parameters derived from them such as dynamic resistance and voltage intercept, can be used to compare the properties of different devices and can be used to determine the performance of a device in a circuit.

In one embodiment, the apparatus can comprise two sensing probes, wherein each of the two sensing probes is configured to generate a signal in direct proportion to the voltage applied to the conductor at the corresponding measurement point, wherein a distance between the corresponding two measurement points is defined in such a way, that a transit time of the electrical pulse between the measurement points can be determined, for example by the determination means, and wherein the determination means comprises a means for iteratively determining a voltage profile of the electrical pulse and a voltage profile of a part of the electrical pulse that is reflected at the device under test based on the signals generated by the two sensing probes, and the transit time of the pulse between the corresponding measurement points, and a means for determining the change of the voltage generated at the device under test in response to the electrical pulse over time and the change of the current generated at the device under test in response to the electrical pulse over time based on the voltage profile of the electrical pulse, the voltage profile of the part of the electrical pulse that is reflected at the device under test, and the predetermined electrical properties of the conductor, for example an electrical characteristic wave impedance or attenuation. In total, an apparatus for determining a response of a device under test to an electrical pulse generated by a pulse generator is provided, wherein the pulse can have an arbitrarily long pulse duration, and wherein at the same time a high time resolution can be achieved. Further, only two sensing probes might be used, and therefore, only minimal hardware modifications are required to determine a response of the device under test to the electrical pulse, wherein the determination means is configured to determine a change of a voltage generated at the device under test in response to the electrical pulse over time and a change of a current generated at the device under test in response to the electrical pulse over time.

The apparatus can further comprise a calibration means configured to calibrate the at least two sensing probes before the response of the device under test is determined. Adjustments of current and/or voltage measurements and, in particular, calibrating the at least two sensing probes is important to take into account unavoidable system characteristics such as system wave resistance, sensor sensitivities, line attenuation, mismatch, contact resistances, or shunt resistance. Periodic verification using simple components with known properties insures accurate measurements.

Further, the determination means can be configured to determine the response of the device under test based on the signals generated by the at least two sensing probes, the transit times of the electrical pulse between these different measurement points and interferences. Here interferences mean signal disturbances or degradations caused by electrical or electromagnetic sources, for example noise, or by non-ideal properties of the signal path like signal reflection, attenuation, or dispersions, but also by attenuation introduced by deliberately positioned attenuators. Thereby, the determination of the response of the device can be further improved, especially as such interferences occur in usual non-ideal systems. Further, correctly considering attenuations enables the use of attenuators, which can be deliberately positioned between the sensing probes.

In one embodiment, the apparatus further comprises at least one attenuator, wherein each of the at least one attenuator is respectively positioned between two of the at least two sensing probes. Here an attenuator is an electronic device that reduces the power of a signal without appreciably distorting its waveform. The integration of attenuators into the apparatus has the advantage that attenuation factors are not equal or close to one, whereby the quality of the determined response of the device under test can be improved if the determination means is configured to determine the response of the device under test based on an iterative process.

Further, the apparatus can additionally be configured to perform TLP testing of the device under test and/or to perform Very Fast TLP testing of the device under test. In particular, corresponding parts of known TLP systems, respectively Very Fast TLP systems can simply and quickly be retrofitted to obtain a described apparatus, without extensive and costly rebuilding. For example, additional sensing probes configured to generate a signal in direct proportion to a current flowing in or a voltage applied to the conductor can be correspondingly added to a conductor in a TLP system or a Very Fast TLP system, wherein the additional sensing probes are connected to a corresponding determination means for determining the response of a device under test to an electrical pulse generated by a pulse generator in such a way, that the signals generated by the additional sensors are transmitted to the determination means. The determination means can then be further configured to determine the response of the device under test based on the signals generated by the additional sensing probes and the transit time of the electrical pulse between corresponding different measurement points.

According to a further embodiment of the invention, a system for determining a response of a device under test to an electrical pulse generated by a pulse generator is provided, wherein the system comprises the pulse generator to generate the electrical pulse, the device under test, and an apparatus as described above.

Thereby, an improved system for determining a response of a device under test to an electrical pulse generated by a pulse generator is provided, wherein the pulse can have an arbitrarily long pulse duration, and wherein at the same time a high time resolution can be achieved. In particular, as the system comprises an apparatus with at least two sensing probes, wherein at least two of the at least two sensing probes are positioned at different measurement points of at least two measurement points, the incident and reflected pulses do not have to be recorded well-separated in terms of time, wherefore compared to known Very Fast TLP systems a shorter conductor can be used and the electrical pulse can have a comparatively long pulse duration. Further, due to the fact that distances between these different measurement points on the conductor are defined in such a way, that transit times of the electrical pulse between these different measurement points can respectively be determined, for example by the determination means, the signal transients are different at the at least two measurement points, wherefore they can be used to determine the response of the device under test, wherefore, compared to known TLP systems, the voltage and the current at the device can be determined with high time resolution. Therefore, a system is provided which comprises an apparatus that combines the advantages of both, a common TLP-system and a common Very Fast TLP system.

The device under test can be an integrated circuit device. In particular, it is useful to measure the ways integrated circuits respond to electrical pulses when evaluating their electrostatic discharge ("ESD") protection. Further, especially with faster technologies like SiC and GaN, the transit behavior of switching power devices, modules, and systems becomes increasingly important and has to be analyzed.

According to another embodiment of the invention, also a method for determining a response of a device under test to an electrical pulse generated by a pulse generator is provided, wherein the method comprises the steps of:
  generating the electrical pulse by the pulse generator;
  coupling the electrical pulse generator to the device under test by a conductor, wherein the conductor has a predetermined electrical impedance and a predetermined pulse propagation velocity;
  respectively generating a signal that is in direct proportion to a current flowing in or a voltage applied to the conductor by at least two sensing probes connected to the conductor, wherein each of the at least two sensing probes is positioned at one of at least two measurement points on the conductor and is configured to generate an electrical signal in direct proportion to the current flowing in or the voltage applied to the conductor at the corresponding measurement point, and wherein at least two of the at least two sensing probes are positioned at different measurement points of the at least two measurement points, wherein a distance between two of these different measurement points on the conductor is respectively defined in such a way, that a transit time of the electrical pulse between these two different measurement points can be determined; and determining the response of the device under test to the electrical pulse based on the signals generated by the at least two sensing probes and the transit times of the electrical pulse between these different measurement points.

Therein, preferably the electrical impedance of the conductor is constant over the entire length of the conductor. Further, that the conductor has a predetermined pulse propagation velocity means that the pulse propagation velocity of the conductor is known, wherein preferably the pulse propagation velocity is constant over the entire length of the conductor.

Thereby, an improved method for determining a response of a device under test to an electrical pulse generated by a pulse generator is provided, wherein the pulse can have an arbitrarily long pulse duration, and wherein at the same time a high time resolution can be achieved. In particular, as at least two of the at least two sensing probes are positioned at different measurement points of the at least two measurement points, the incident and reflected pulses do not have to be recorded well-separated in terms of time, wherefore compared to known Very Fast TLP systems a shorter conductor can be used and the electrical pulse can have a comparatively long pulse duration. Further, due to the fact that distances between these different measurement points on the conductor are defined in such a way, that transit times of the electrical pulse between these different measurement points can respectively be determined, for example by the determination means, signal transients are different at the at least two measurement points, wherefore they can be used to determine the response of the device under test, wherefore, compared to known TLP systems, the voltage and the current at the device can be determined with high time resolution. Therefore, a method is provided that combines the advantages of both, a common TLP-method and a common Very Fast TLP method.

Here, that transit times of the electrical pulse between the different measurement points can be determined means that the distance between respectively two successive measurements is selected in such a way, that the distance is at least as large that a transit time of the pulse between these successive measurement points can be determined based on the resolution of the used measurement means, respectively of the used sensing probes and the used determination means. Thus, the measured signal transients are different at the at least two measurement points, wherefore the difference between the signal transients measured at the at least two measurement points can be used to determine the response of the device under test with a high temporal resolution. Therein, the transit time can for example be determined respectively acquired by the sensing probes and the determination means itself. Further, for example also time stamps may be added to the signals generated by the corresponding sensing probes, wherein the transit times are determined based on the time stamps. On the other hand, the test arrangement, and therefore, also the transit times between these different measurement points may already be known, wherein the corresponding transit times can for example be stored in a look-up table, and wherein the transit times can be determined based on the look-up table.

Further, the step of determining the response of the device under test based on the signals generated by the at least two sensing probes can comprise the step of determining a change of a voltage generated at the device under test in response to the electrical pulse over time and/or a change of a current generated at the device in response to the electrical pulse over time. Therefore, also the described method can be used to produce current/voltage curves in which each data point is from an electrical pulse whose duration and current amplitude are in the same range as system level electrostatic discharge events, like known TLP systems. These current/voltage curves, and parameters derived from them such as dynamic resistance and voltage intercept, can be used to compare the properties of different devices and can be used to determine the performance of a device in a circuit.

In one embodiment, a signal that is in direct proportion to the voltage applied to the conductor at the corresponding measurement point is respectively generated by two sensing probes, wherein a distance between the corresponding two measurement points is defined in such a way, that a transit time of the electrical pulse between the measurement points can be determined, for example by the determination means. Therein, the step of determining the response of the device under test to the electrical pulse based on the signals generated by the sensing probes further comprises the steps of iteratively determining a voltage profile of the electrical pulse and a voltage profile of a part of the electrical pulse that is reflected at the device under test based on the signals generated by the two sensing probes, and a transit time of the pulse between the corresponding measurement points, and determining the change of the voltage generated at the device under test in response to the electrical pulse over time and the change of the current generated at the device under test in response to the electrical pulse over time based on the voltage profile of the electrical pulse, the voltage profile of the part of the electrical pulse that is reflected at the device under test, and the predetermined electrical impedance. In total, a method for determining a response of a device under test to an electrical pulse generated by a pulse generator is provided, wherein the pulse can have an arbitrarily long pulse duration, and wherein at the same time a high time resolution can be achieved. Further, only two sensing probes might be used, and therefore, only minimal hardware modifications are required, to determine a response of the device under test to the electrical pulse, wherein a change of a voltage generated at the device under test in response to the electrical pulse over time and a change of a current generated at the device under test in response to the electrical pulse over time is determined.

The method can further comprise the step of calibrating the at least two sensing probes before the response of the device under test is determined. Adjustments of current and/or voltage measurements and, in particular, calibrating the at least two sensing probes is important to remove unavoidable non-ideal system characteristics such as system resistance, contact resistances, and shunt resistance. Periodic verification using simple components with known properties insures accurate measurements.

In one embodiment, the step of determining the response of the device under test based on the signals generated by the at least two sensing probes can comprise determining the response of the device under test based on the signals generated by the at least two sensing probes, the transit times of the electrical pulse between these different measurement points and interferences. Here interferences mean signal disturbances or degradations caused by electrical or electromagnetic sources, for example noise, or by non-ideal properties of the signal path like signal reflection, attenuation, or dispersions, but also by attenuation introduced by deliberately positioned attenuators. Thereby, the determination of the response of the device can be further improved, especially as such interferences occur in usual non-ideal systems. Further, correctly considering attenuations enables the use of attenuators, which can be deliberately positioned between the sensing probes.

Therein, there might further be at least one attenuator, wherein each of the at least one attenuator is respectively positioned between two of the at least two sensing probes. The integration of attenuators has the advantage that attenuation factors are not equal or close to one, whereby the quality of the determined response of the device under test can be improved if the determination means is configured to determine the response of the device under test based on an iterative process.

According to still a further embodiment of the invention a program product is provided, the program product comprising a computer-readable storage medium that stores code executable by a processor, the executable code comprising code:

to instruct a pulse generator to generate an electrical pulse, wherein the electrical pulse is coupled to a device under test by a conductor, wherein the conductor has a predetermined electrical impedance and a predetermined pulse propagation velocity;

to respectively instruct at least two sensing probes connected to the conductor to generate a signal that is in direct proportion to a current flowing in or a voltage applied to the conductor, wherein each of the at least two sensing probes is positioned at one of at least two measurement points on the conductor and is configured to generate an electrical signal in direct proportion to the current flowing in or the voltage applied to the conductor at the corresponding measurement point, and wherein at least two of the at least two sensing probes are positioned at different measurement points of the at least two measurement points, wherein a distance between two of these different measurement points on the conductor is respectively defined in such a way, that a transit time of the electrical pulse between these two different measurement points can be determined; and to determine the response of the device under test to the electrical pulse based on the signals generated by the at least two sensing probes and the transit times of the electrical pulse between these different measurement points.

Therein, preferably the electrical impedance of the conductor is constant over the entire length of the conductor. Further, that the conductor has a predetermined pulse propagation velocity means that the pulse propagation velocity of the conductor is known, wherein preferably the pulse propagation velocity is constant over the entire length of the conductor.

Thus, a program product, on which code of an improved method for determining a response of a device under test to an electrical pulse generated by a pulse generator is stored, is provided, wherein the method is accomplished in such a way, that the pulse can have an arbitrarily long pulse duration, and wherein at the same time a high time resolution can be achieved. In particular, as at least two of the at least two sensing probes are positioned at different measurement points of the at least two measurement points, the incident and reflected pulses do not have to be recorded well-separated in terms of time, wherefore compared to known Very Fast TLP systems a shorter conductor can be used and the electrical pulse can have a comparatively long pulse duration. Further, due to the fact that distances between these different measurement points on the conductor are defined in such a way, that transit times of the electrical pulse between these different measurement points can be determined, for example by the determination means, wherein the response of the device under test is determined based on the signals generated by the at least two sensing probes and the transit times of the electrical pulse between these different measurement points, signal transients are different at the at least two measurement points, wherefore they can be used to determine the response of the device under test, wherefore, compared to known TLP systems, the voltage and the current at the device can be determined with high time resolution.

Therefore, code for a method combines the advantages of both, a common TLP-method and a common Very Fast TLP method, is stored on the program product.

As can be appreciated from herein, the determination means can refer to determination device. The determination device can be a computer device that includes hardware. The hardware can include a processor connected to non-transitory memory that can have code stored thereon that defines an embodiment of our method and/or other method. The code can, for example, define a process by which the determination device can make one or more determinations based on parameters as discussed herein, for example.

Other aspects, features and advantages of the invention will become apparent by the below description of exemplary embodiments alone or in cooperation with the appended drawings.

BRIEF DESCRIPTION OF THE DRAWINGS

Exemplary embodiments of processes, apparatuses, systems, and methods of making and using the same are shown in the drawings included herewith. It should be understood that like reference characters used in the drawings may identify like components.

Figure 1:
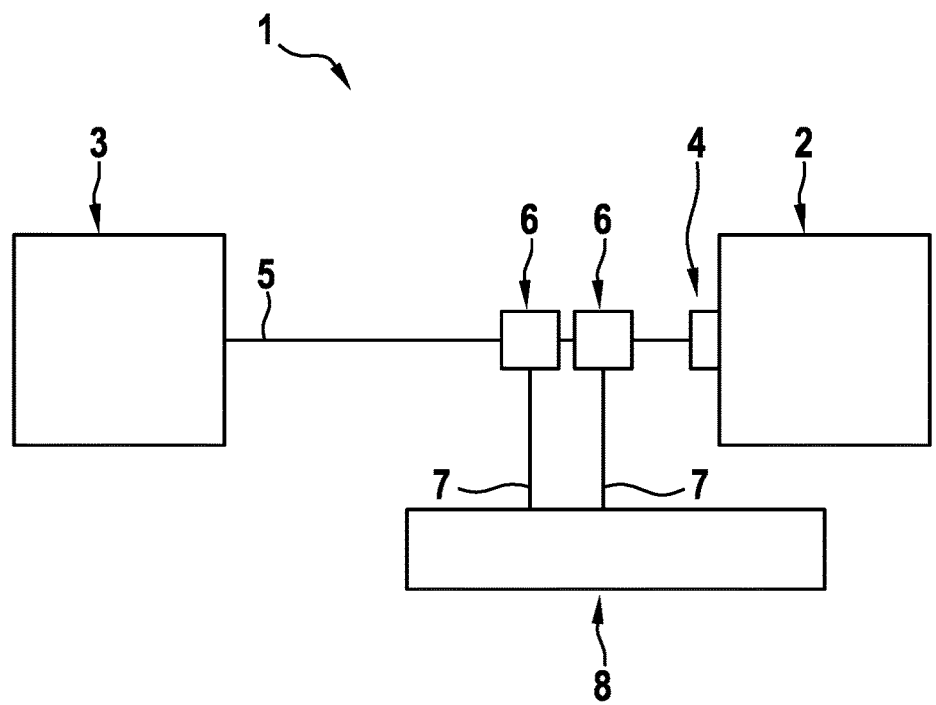
FIG. 1 is a schematic functional diagram of a known Transmission Line Pulse system for determining a response of a device under test to an electrical pulse generated by a pulse generator.

Reference numerals utilized in the drawings include:
1 TLP system
2 device under test
3 pulse generator
4 input terminal
5 impedance path
6 sensor
7 transmission line
8 determination means
10 system
11 apparatus
12 conductor
13 sensing probe
14 measurement point
15 determination means
16 electrical autocorrelator
17 last measurement point
18-20 means
21 calibration means
22 integrated circuit device
30 system
31 determination means
32 attenuator
40 method
41-44 step

DETAILED DESCRIPTION

FIG. 1 is a schematic functional diagram of a known Transmission Line Pulse (TLP) system 1 for determining a response of a device under test 2 to an electrical pulse generated by a pulse generator 3.

As shown in FIG. 1, the pulse generator 3 respectively TLP pulser generates an electrical pulse that is transmitted to an input terminal 4 of the device under test 2 through a constant impedance path 5. Therein, the electrical pulse generated by the pulse generator 3 is usually a substantially rectangular pulse, wherein the pulse can for example be generated in response to a signal of a personal computer connected to the pulse generator 3. Further, the constant impedance path 5 can comprise a conventional cable or any other structure configured for coupling a pulse between two circuits or devices.

FIG. 1 further shows sensors 6 for sensing a current flowing in and a voltage applied to the constant impedance path 5, wherein corresponding sensing probes, for example current probes and/or voltage probes, are inserted into the constant impedance path 5 to generate signals in response to the current flowing in respectively voltage applied to the constant impedance path 5. There are further shown transmission lines 7 through which the signals generated by the sensing probes are transmitted to a determination means 8 that is configured for determining a response of the device under test 2 to the electrical pulse generated by the pulse generator 3. However, that the signals generated by the sensing probes are transmitted to the determination means 8 via a transmission line should merely be understood as an example, and the signals generated by the sensing probes can also be transmitted to the determination unit in any other known form, for example wirelessly. As the sensing probes usually provide an analog output signal, these analog output signals may also first be inputted into a digitizer before being transmitted to the determination means 8, wherein the digitizer provides a digital signal representation of the analog output signal.

Such a TLP system 1 is usually designed to measure the ways the device under test 2, for example an integrated circuit, responds to current and voltage pulses that are delivered to it by the pulse generator 3, wherein all elements apart from the device under test are adapted to the impedance of the constant impedance path 5. Therein, the pulse generator 3 delivers an initial, or incident TLP pulse through the constant impedance path 5 to the input terminal 4 of the device under test 2. When the incident TLP pulse reaches the device under test 2, it is partly reflected by the device under test 2 and new current and voltage pulse waveforms result. The reflected pulse overlaps with the incident pulse as it travels back up the constant impedance path 5 in the opposite direction, toward the pulse generator 3. The constant impedance path 5 is designed in a manner known in the art to avoid significant pulse distortions, so that the reflected pulse may be accurately measured by the sensing probes and the dynamic impedance of the device under test may be calculated in the determination means 8 by comparing the ratio of the incident and the reflected pulse.

Therein, typically current and/or voltage oscilloscope probes are used to measure the incident and the reflected current and/or voltage pulse waveforms. These probes are positioned in the constant impedance path 5 at a selected insertion point where the incident and the reflected pulses are expected to overlap. However, there is always a time delay between the incident and the reflected pulses when there is any length of cable between an oscilloscope probe and the device under test, wherein these delays usually cause measurement errors. Therefore, in known TLP techniques, the oscilloscope probes and the device under test are usually positioned close to each other, in order to avoid these measurements errors as much as possible. Therefore, although comparatively long pulses can be used, the time resolution that can be achieved is limited, wherein, however, in order to accurately determine the capacitive and inductive features of the device under test 2, it is necessary to determine the voltage and the current at the device under test 2 with high time resolution.

Therefore, techniques with TLP pulse widths of less than 10 nanoseconds have been developed, which are commonly termed Very Fast TLP or VF-TLP. In Very Fast TLP systems usually a single voltage sensor is positioned between a pulse generator and a device under test in such a way, that the incident and reflected pulses can be separately recorded in terms of time, whereby the time resolution when determining the voltage and the current at the device can be significantly improved. However, for example due to cable loss, only a constant impedance cable of limited length, and therefore, only very short pulses can be used in Very Fast TLP systems.

Therefore, there is a need for a system for determining a response of a device under test to an electrical pulse generated by a pulse generator, wherein the pulse can have an arbitrarily long pulse duration, and wherein at the same time a high time resolution can be achieved.

Figure 2:
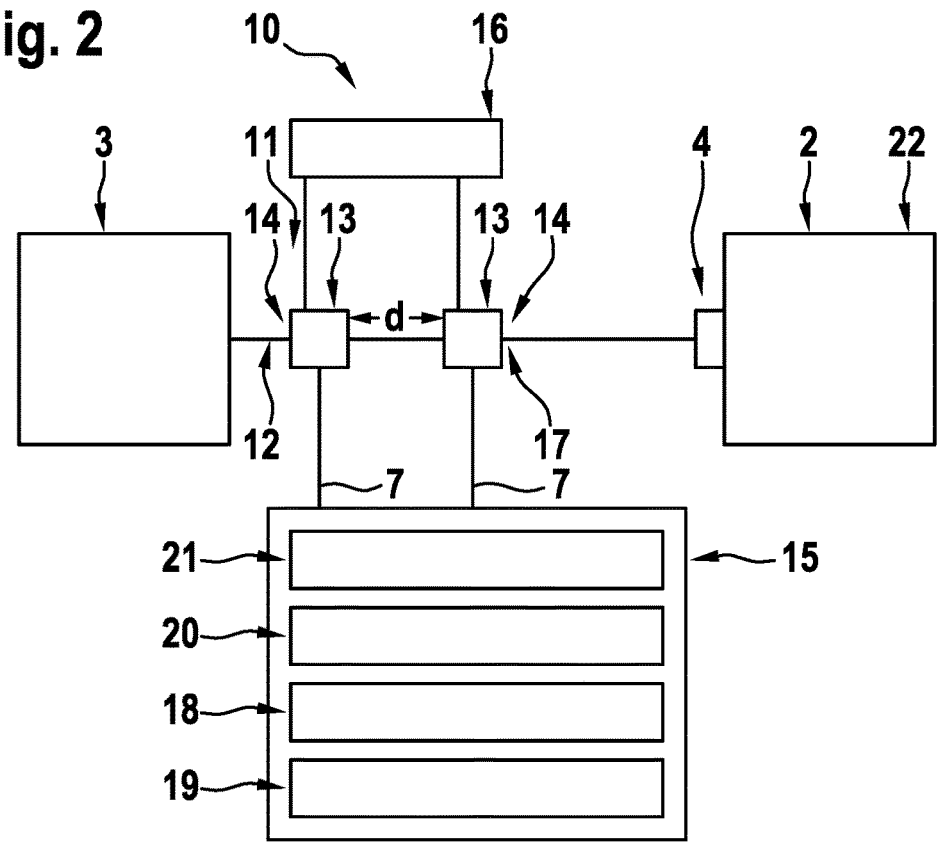
FIG. 2 is a schematic functional diagram of a system for determining a response of a device under test to an electrical pulse generated by a pulse generator, according to a first embodiment of the invention.

FIG. 2 is a schematic functional diagram of a system 10 for determining a response of a device under test 2 to an electrical pulse generated by a pulse generator 3, according to a first embodiment of the invention. Therein, the same elements as in FIG. 1 are given the same reference numbers as in FIG. 1 and are not discussed in any further detail here.

As shown in FIG. 2, the system 10 comprises the device under test 2, the pulse generator 3, and an apparatus 11 for determining a response of the device under test 2 to an electrical pulse generated by the pulse generator 3, wherein the apparatus 11 comprises a conductor 12 for coupling the electrical pulse generator to the device under test 2, wherein the conductor 12 has a predetermined electrical impedance and a predetermined pulse propagation velocity. Further, at least two sensing probes 13 are connected to the conductor 12, wherein two sensing probes are shown in FIG. 2, and wherein each of the at least two sensing probes 13 is positioned at one of at least two measurement points 14 on the conductor 12 and is configured to generate a signal in direct proportion to a current flowing in or voltage applied to the conductor 12 at the corresponding measurement point 14, and a determination means 15 for determining the response of the device under test 2 to the electrical pulse based on the signals generated by the at least two sensing probes 13. Therein, the two sensing probes 13 shown in FIG. 2 are positioned at different measurement points 14 of the at least two measurement points, wherein a distance d between these different measurement points on the conductor is defined in such a way, that a transit time of the electrical pulse between these different measurement points 14 can be determined, wherein the determination means 15 is configured to determine the response of the device under test 2 based on the signals generated by the at least two sensing probes 13 and the transit time of the electrical pulse between these different measurement points 14.

Therein, that the conductor 12 has a predetermined electrical impedance means that the electrical characteristic wave impedance of the conductor 12 is known, wherein preferably the electrical impedance of the conductor 12 is constant over the entire length of the conductor 12. Further, that the conductor 12 has a predetermined pulse propagation velocity means that the pulse propagation velocity of the conductor 12 is known, wherein preferably the pulse propagation velocity is constant over the entire length of the conductor 12. Furthermore, the conductor 12 can again comprise a conventional cable or any other structure configured for coupling a pulse between two circuits or devices, wherein all elements apart from the device under test 2 can again be adapted to the predetermined electrical impedance.

FIG. 2 shows a system 10 with an improved apparatus 11 for determining a response of the device under test 2 to an electrical pulse generated by the pulse generator 3, wherein the pulse can have an arbitrarily long pulse duration, and wherein at the same time a high time resolution can be achieved. In particular, as at least two of the at least two sensing probes 13 are positioned at different measurement points 14 of the at least two measurement points 14, the incident and reflected pulses do not have to be recorded well-separated in terms of time, wherefore compared to known Very Fast TLP systems a shorter conductor 12 can be used and the electrical pulse can have a comparatively long pulse duration. Further, due to the fact that distances d between these different measurement points 14 on the conductor 12 are defined in such a way, that transit times of the electrical pulse between these different measurement points 14 can respectively be determined, for example by the determination means, signal transients are different at the at least two measurement points, wherefore they can be used to determine the response of the device under test 2, wherefore, compared to known TLP systems 1, the voltage and the current at the device under test 2 can be determined with high time resolution. Therefore, a system 10 with an apparatus 11 that combines the advantages of both, a common TLP-system and a common Very Fast TLP system, is provided.

According to the embodiments of FIG. 2, the transit time of the electrical pulse between the different measurement points is determined by an electrical autocorrelator 16. However, that the transit time is determined by an electrical autocorrelator should merely be understood as an example, and the transit time can also be determined by any other known means configured to determine a transit time of an electrical pulse. Further, for example the transit time, can also be determined by the sensing probes and determination means, and/or time stamps may be added to the signals generated by the corresponding sensing probes, wherein the transit time is determined based on the time stamps. On the other hand, the test arrangement, and therefore, also the transit time between these different measurement points may already be known, wherein the corresponding transit time can for example be stored in a look-up table, and wherein the transit time can be determined based on the look-up table.

The determination means can further for example be an oscilloscope. However, at least parts of the determination means can also be realized by code that is stored in a memory and executable by a processor.

According to the embodiments of FIG. 2, each of the at least two sensing probes 13 is further configured to generate a signal in direct proportion to the voltage applied to the conductor 12.

Further, as can be seen in FIG. 2, each of the at least two sensing probes 13 is positioned at a separate measurement point 14, wherein a distance d between two successive measurement points is defined in such a way, that a transit time of the electrical pulse between the corresponding successive measurement points 14,17 can be determined, and wherein a distance between a last measurement point 17 and the device under test 2 is defined in such a way, that a transit time of the electrical pulse between the last measurement point 17 and the device under test 2 can be determined, and wherein the determination means 15 is configured to determine the response of the device under test 2 based on the signals generated by the at least two sensing probes, the respective transit times of the electrical pulse between successive measurement points 14,17, and possibly also the transit time of the electrical pulse between the last measurement point 17 and the device under test 2.

Therein, the last measurement point 17 is the measurement point closest to the device under test 2.

The determination means 15 is configured to determine a change of a voltage generated at the device under test 2 in response to the electrical pulse over time and/or a change of a current generated at the device under test in response to the electrical pulse over time. Therein, the determination means 15 may for example be configured to provide a video display of the change of the voltage generated at the device under test 2 in response to the electrical pulse over time and/or the change of the current generated at the device under test 2 in response to the electrical pulse over time.

In particular, as can be seen in FIG. 2, the shown apparatus 11 comprises two sensing probes 13, wherein each of the two sensing probes 13 is configured to generate a signal in direct proportion to the voltage applied to the conductor 12, wherein a distance d between the corresponding two measurement points 14, 17 is defined in such a way, that a transit time of the electrical pulse between the measurement points can be determined. As can be also seen in FIG. 2, the shown determination means 15 comprises a means 18 for iteratively determining a voltage profile of the electrical pulse and a voltage profile of a part of the electrical pulse that is reflected at the device under test based on the signals generated by the two sensing probes 13, and a transit time of the pulse between the corresponding measurement points 14,17, and a means 19 for determining the change of the voltage generated at the device undertest 2 in response to the electrical pulse over time and the change of the current generated at the device under test 2 in response to the electrical pulse over time based on the voltage profile of the electrical pulse, the voltage profile of the part of the electrical pulse that is reflected at the device under test, and the predetermined electrical properties of the conductor, for example an electrical wave impedance or attenuation.

The shown determination means 15 further comprises a means zo for preprocessing the signals generated by the sensing probes 13, wherein the means zo for preprocessing the signals generated by the sensing probes 13 can for example include a digitizer that provides a digital signal representation of analog output signals generated by the sensing probes 13, a means for performing mathematical operations, for example filter operations on the analog output signals and/or the digital representation of the analog output signals, and/or a selecting means for selecting sensing probes of which the generated signals should be further processed.

It should be appreciated that the determination means 15 can include, for example, a determination device that includes hardware. The determination device can include, for example, hardware that is configured to determine a response of the device under test 2 based on a pre-defined process and one or more parameters. The parameters, can include, for example, parameters discussed herein (e.g. signals generated by the sensing probes 13 and the transit time of the electrical pulse between these different measurement points of the sensing probes 13, etc.).

As shown in FIG. 2, the apparatus 11 further comprises a calibration means 21 configured to calibrate the parameters of the setup before the response of the device under test 2 is determined. The calibration means 21 is configured to synchronize the sensing probes 13, to take into account their exact sensitivities or to take into account the parameters that are required by the means 18 in order to perform the corresponding determinations. Therein, the calibration can at least in part be done by utilizing dedicated calibration experiments.

According to the embodiments of FIG. 2, the apparatus 11 is additionally configured to perform Very Fast TLP testing of the device under test 2. In particular, if the pulse is short enough and it is selected in the means 20 for processing the signals generated by the sensing probes 13 that only the signals generated by the sensing probe 13 positioned at the last measurement point 17 should be processed, the procedure is equal to Very Fast TLP testing.

The device under test can be an integrated circuit device 22. In particular, it is useful to measure the ways integrated circuits respond to electrical pulses when evaluating their electrostatic discharge ("ESD") protection. Further, with faster technologies like SiC and GaN, the transit behavior of switching power devices, modules, and systems becomes increasingly important and has to be analyzed.

Figure 3:
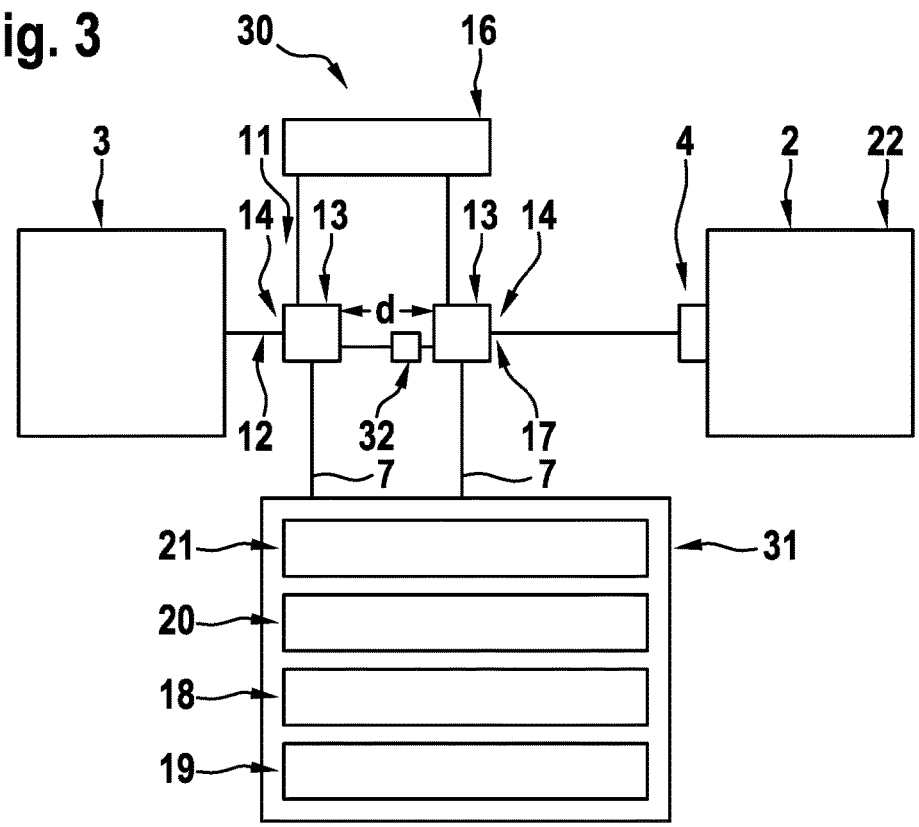
FIG. 3 is a schematic functional diagram of a system for determining a response of a device under test to an electrical pulse generated by a pulse generator, according to a second embodiment of the invention.

FIG. 3 is a schematic functional diagram of a system 30 for determining a response of a device under test 2 to an electrical pulse generated by a pulse generator 3, according to a second embodiment of the invention. Therein, the same elements as in FIG. 1 or FIG. 2 are given the same reference numbers as in FIG. 1 and are not discussed in any further detail here.

As shown in FIG. 3, also the system 30 according to the second embodiment comprises the device under test 2, the pulse generator 3, and the apparatus 11 for determining a response of the device under test 2 to an electrical pulse generated by the pulse generator 3, wherein the apparatus 11 comprises a conductor 12 for coupling the electrical pulse generator to the device under test 2, wherein the conductor 12 has a predetermined electrical impedance and a predetermined pulse propagation velocity. Further, at least two sensing probes 13 are connected to the conductor 12, wherein two sensing probes are shown in FIG. 3, and wherein each of the at least two sensing probes 13 is positioned at one of at least two measurement points 14 on the conductor 12 and is configured to generate a signal in direct proportion to a current flowing in or voltage applied to the conductor 12 at the corresponding measurement point 14, and a determination means 31 for determining the response of the device under test 2 to the electrical pulse based on the signals generated by the at least two sensing probes 13, wherein at least two of the at least two sensing probes 13 are positioned at different measurement points 14 of the at least two measurement points, wherein a distance d between two of these different measurement points on the conductor is respectively defined in such a way, that a transit time of the electrical pulse between these two different measurement points 14 can be determined, wherein the determination means 31 is configured to determine the response of the device under test 2 based on the signals generated by the at least two sensing probes 13 and the transit times of the electrical pulse between these different measurement points 14.

The main difference between the system 30 according to the second embodiment as shown in FIG. 3 and the system 10 according to the first embodiment as shown in FIG. 2 is that the determination means 31 of the system 30 according to the second embodiment is that in the system according to the second embodiment attenuators 32 are positioned between one or more pairs of sensing probes, wherein the system 30 is configured to determine the response of the device under test based on the signals generated by the at least two sensing probes, the transit time of the electrical pulse between these different measurement points and additional effects like noise, disturbances, reflection and attenuation along the conductor 12.

Interferences, which usually occur in non-ideal systems and which can for example include noise, disturbances, reflections or signal attenuations, can for example result in the fact that signals reconstructed by the determination means 31 show an increasing noise amplitude and/or a distorted signal slope, especially if the determination means 31 is configured to reconstruct these signals based on an iterative process. Therein, the signal slope can be an artefact, that results from reflections and/or signal attenuations within the conductor, respectively when the electrical pulse travels through the conductor. However, if reflections and damping along the conductor are correctly taken into account by the determination means 31, the signal slope can be determined correctly. Further, if filtering steps are included in the process to reconstruct the signals, artificial increasing of the noise amplitude can be avoided. Further, an increase of the artificial noise can be reduced by integrating the attenuators 32 into the setup, provided that the determination means 31 takes damping into account.

Thereby, the determination of the response of the device can be further improved, as such interferences occur in usual non-ideal systems.

According to the embodiment of FIG. 3, the shown apparatus 11 further comprises attenuators 32, wherein respectively one attenuator 32 is positioned between two of the sensing probes 13. By integration of these attenuators, the corresponding attenuation factors can be decreased.

Figure 4:
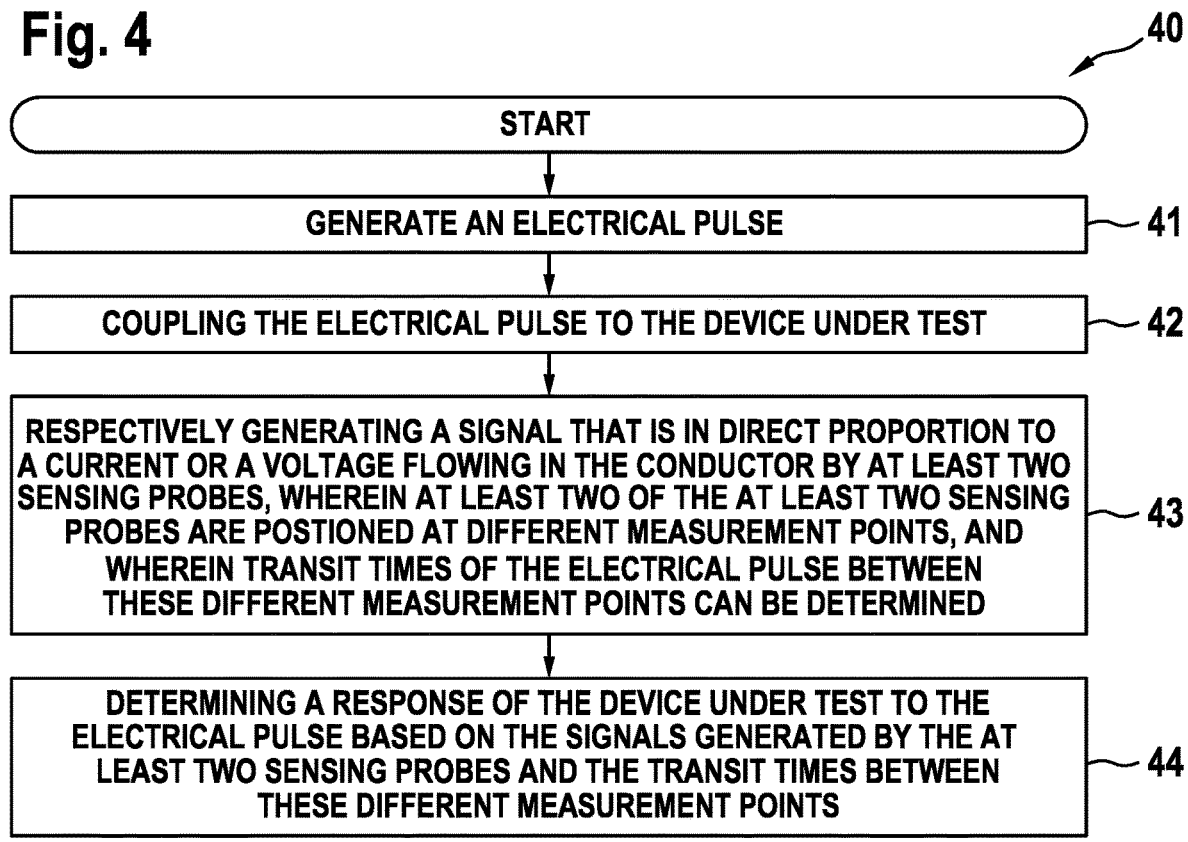
FIG. 4 is a flow chart of a method for determining a response of a device under test to an electrical pulse generated by a pulse generator, according to embodiments of the invention.

FIG. 4 is a flow chart of a method 40 for determining a response of a device under test to an electrical pulse generated by a pulse generator, according to embodiments of the invention.

Therein, according to the embodiments of FIG. 4, the method 40 comprises the steps of generating an electrical pulse by a pulse generator 41, and coupling the electrical pulse to the device under test by a conductor 42, wherein the conductor has a predetermined electrical impedance and a predetermined pulse propagation velocity.

The shown method 40 further comprises the step of respectively generating a signal that is in direct proportion to a current flowing in or a voltage applied to the conductor by at least two sensing probes connected to the conductor 43, wherein each of the at least two sensing probes is positioned at one of at least two measurement points on the conductor and is configured to generate an electrical signal in direct proportion to the current flowing in or the voltage applied to the conductor at the corresponding measurement point. Therein, at least two of the at least two sensing probes are positioned at different measurement points of the at least two measurement points, wherein a distance d between two of these different measurement points on the conductor is respectively defined in such a way, that a transit time of the electrical pulse between these two different measurement points can be determined.

There is further shown a step determining the response of the device under test to the electrical pulse based on the signals generated by the sensing probes 44, wherein the response of the device under test is further determined based on the signals generated by the at least two sensing probes and the transit times of the electrical pulse between these different measurement points.

According to the embodiments of FIG. 4, the step of determining the response of the device under test based on the signals generated by the at least two sensing probes 44 further comprises determining the response of the device under test based on the signals generated by the at least two sensing probes, the transit times of the electrical pulse between these different measurement points and interferences, for example reflection and attenuation along the signal path.

In particular, auxiliary functions that take into account the interferences can be used to determine the response of the device under test, wherein, considering a situation that two sensing probes are connected to the conductor, the auxiliary functions $U_{hh}$ regarding the travelling of the electrical pulse from the pulse generator to the device under test and $U_{rr}$ regarding the travelling of the part of the electrical pulse in the direction back to the pulse generator can be defined as follows:

$$U_{hh}(t) := \delta_{12} \cdot s_1(t - T_{12}) + \frac{r_2}{1+r_2} \cdot s_2(t) - \frac{\delta_{12}^2(1+2r_2)}{1+r_2} \cdot s_2(t - 2 \cdot T_{12}) \quad (1a)$$

respectively in the Laplace representation $$U_{hh} := \delta_{12} e^{-sT_{12}} s_1 + \left( \frac{r_2}{1+r_2} - \frac{\delta_{12}^2(1+2r_2)}{1+r_2} e^{-s2T_{12}} \right) s_2 \quad (1b)$$

with $U_{hh}(t) = U_{H2}(t) - \delta_{12}^2 U_{H2}(t - 2 \cdot T_{12})$ \quad (2a)

respectively in the Laplace representation $$U_{hh} = (1 - \delta_{12}^2 e^{-s2T_{12}}) U_{H2} \quad (2b)$$

and $U_{rr}(t) := -\delta_{12} \cdot s_1(t - T_{12}) + \frac{1}{1+r_2} \cdot s_2(t) + \frac{\delta_{12}^2 2r_2}{1+r_2} \cdot s_2(t - 2 \cdot T_{12})$ \quad (3a)

respectively in the Laplace representation $$U_{rr} := -\delta_{12} e^{-sT_{12}} s_1 + \left( \frac{1}{1+r_2} + \frac{\delta_{12}^2 r_2}{1+r_2} e^{-s2T_{12}} \right) s_2 \quad (3b)$$

with $U_{rr}(t) = U_{R2}(t) - \delta_{12}^2 U_{R2}(t - 2 \cdot T_{12})$ \quad (4a)

respectively in the Laplace representation $$U_{rr} = (1 - \delta_{12}^2 e^{-s2T_{12}}) U_{R2} \quad (4b),$$

wherein $\delta_{12}$ is the attenuation factor of the attenuation of a signal travelling within the conductor from the first sensing probe to the second sensing probe, wherein the signal is in direct proportion to the voltage applied to a conductor, $e^{sT_{12}}$ and $e^{s2T_{12}}$ are operators that respectively define a propagation delay $T_{12}$ regarding the signal travelling from the first sensing probe to the second sensing probe, $s_1$ is the strength of the signal acquired respectively generated at the first sensing probe at a particular time, $r_2$ is the reflection factor regarding reflections of the signal at the second sensing probe, $U_{H2}$ represents the signal travelling from the pulse generator to the device under test after having travelled through the second sensing probe, $s_2$ is the strength of the signal acquired respectively generated by the second sensing probe at the particular time, and $U_{R2}$ represents the part of the signal that has been reflected by the device under test and is travelling back in the direction to the pulse generator after having travelled up to the second sensing probe. Therein, the factors $\delta_{12}$ and $r_2$ can for example be derived based on the calibrations of the two sensing probes.

Based on these auxiliary functions, $U_{H2}$ and $U_{R2}$ can then be derived as follows, using an iterative process:

$$U_{H2}(t) = U_{hh}(t) + \delta_{12}^2 U_{hh}(t-2 \cdot T_{12}) + \delta_{12}^2 U_{hh}(t-4 \cdot \Delta T_{12}) + \delta_{12}^2 U_{hh}(t-6 \cdot T_{12}) + \quad (5a)$$

respectively in Laplace representation $$U_{H2} = U_{hh} + \delta_{12}^2 e^{-s2T_{12}} U_{hh} + \delta_{12}^4 e^{-s4T_{12}} U_{hh} + \delta_{12}^6 e^{-s6T_{12}} U_{hh} + \quad (5b)$$

and $$U_{R2}(t) = U_{rr}(t) + \delta_{12}^2 U_{rr}(t-2 \cdot T_{12}) + \delta_{12}^4 U_{rr}(t-4 \cdot T_{12}) + \delta_{12}^6 U_{rr}(t-6 \cdot T_{12}) + \quad (6a)$$

respectively in Laplace representation $$U_{R2} = U_{rr} + \delta_{12}^2 e^{-s2T_{12}} U_{rr} + \delta_{12}^4 e^{-s4T_{12}} U_{rr} + \delta_{12}^6 e^{-s6T_{12}} U_{rr} + \quad (6b)$$

Thereafter, the electrical pulse travelling through the conductor from the pulse generator to the device under test $U_h$ and the part of the electrical pulse that is reflected at the device under test and travelling back through the conductor $U_r$ can be reconstructed based on the following equations:

$$U_h(t) = \delta_{2P} U_{H2}(t - T_{2P}) \quad (7a)$$

respectively $U_h = \delta_{2P} e^{-sT_{2P}} U_{H2}$ \quad (7b)

and $U_r(t) = \frac{1}{\delta_{2P}} U_{R2}(t + T_{2P})$ \quad (8a)

respectively $U_r = \frac{1}{\delta_{2P}} e^{-sT_{2P}} U_{R2},$ \quad (8b)

wherein $\delta_{2P}$ is the attenuation factor of the attenuation and $T_{2P}$ is the transit time of a signal, respectively travelling within the conductor from the second sensing probe to the device under test.

Further, a change of a voltage generated at the device under test in response to the electrical pulse over time, $U_{DUT}(t)$. And a change of a current flowing into the device under test in response to the electrical pulse over time. $I_{DUT}(t)$, can then be determined based on these reconstructed voltage profiles $U_h(t)$ and $U_r(t)$ and the wave impedance $Z_0$ of the conductor using the following well-known equations:

$$U_{DUT}(t)=U_h(t)+U_r(t) \tag{9a}$$

$$Z_0 \cdot I_{DUT}(t)=U_h(t)-U_r(t) \tag{9b}$$

Therein, the influence of noise can be further reduced by combining the above-stated derivation of $U_h$ and $U_r$ with filtering operations, for example utilizing an additional filtering operation in each iteration step. Further, remaining distortions due to dispersions can be compensated by slightly amending the above-stated auxiliary functions or by using known unfolding processes.

Further, by respectively positioning one attenuator 32 positioned behind one of the sensing probes with respect to a direction from the pulse generator to the device under test, the attenuation factor $\delta_{12}$ decreases, whereby the above-stated derivation of Ph and Pr can be further simplified, as the ascending powers of $\delta_{12}$ converge towards zero FIG. 5A-5G illustrate the determination of a voltage profile of the electrical pulse and a voltage profile of a part of the electrical pulse that is reflected at the device under test, according to one embodiment of the invention.

In particular, FIG. 5A-5G illustrate the determination of a voltage profile of the electrical pulse and a voltage profile of a part of the electrical pulse that is reflected at the device under test according to one embodiment of the invention, in which a signal that is in direct proportion to the voltage applied to the conductor is respectively generated by two sensing probes, wherein a distance between the corresponding two measurement points is defined in such a way, that a transit time of the electrical pulse between the two measurement points can be determined.

Figure 5A:
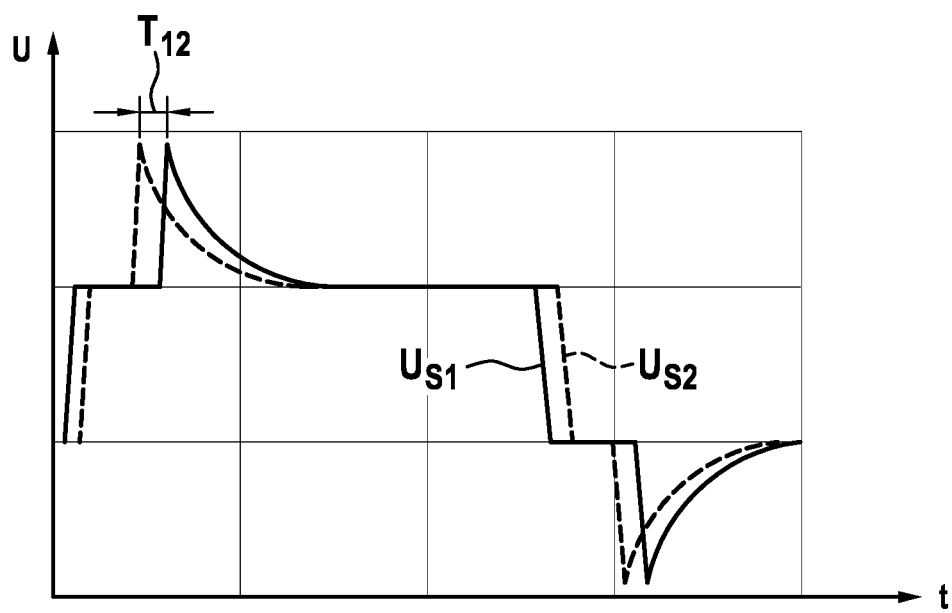
FIG. 5A illustrates exemplary voltage curves.
Figure 5B:
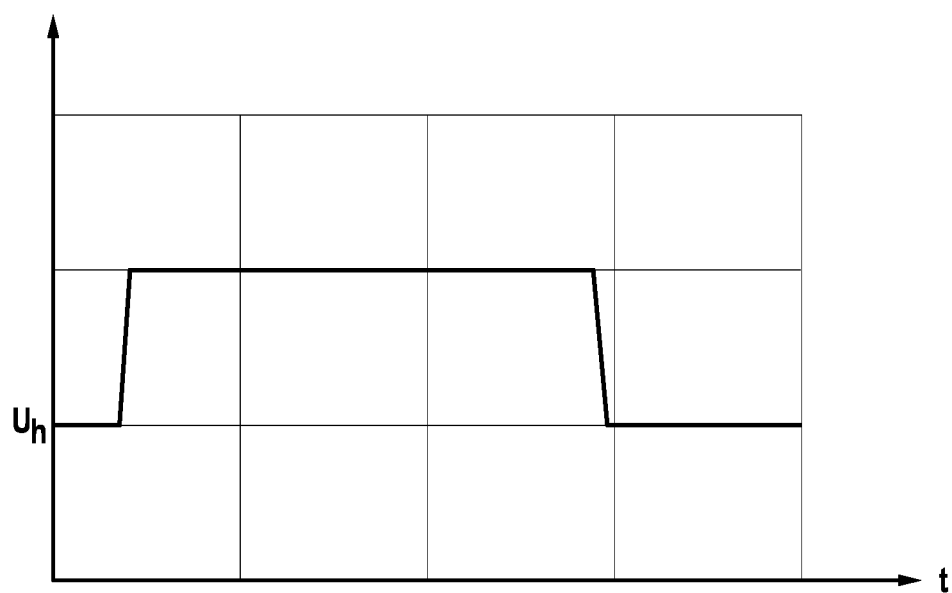
FIG. 5B illustrates a graph showing an exemplary incident pulse.
Figure 5C:
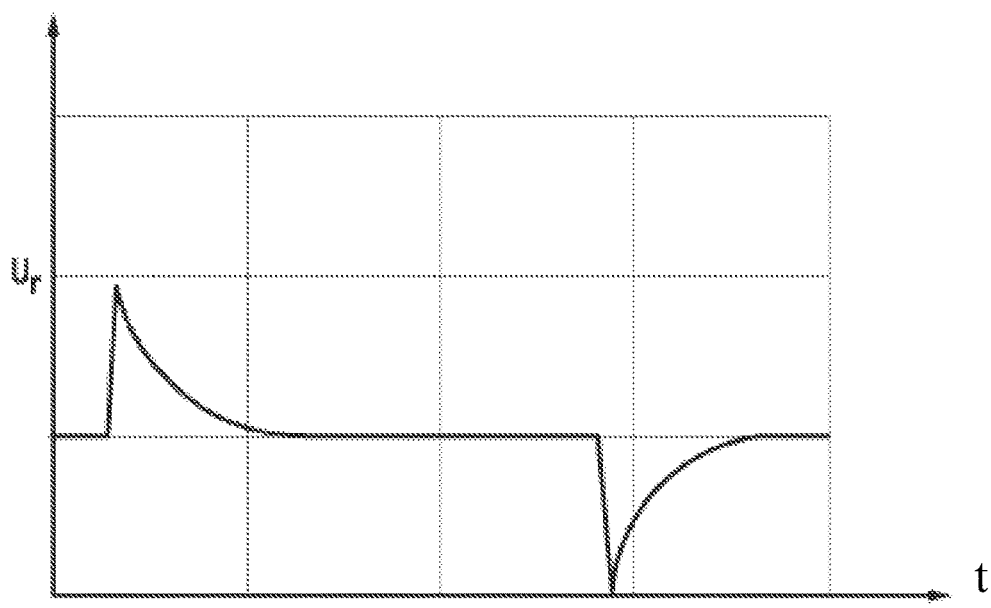
FIG. 5C illustrates a graph showing an exemplary reflected pulse.
Figure 5D:
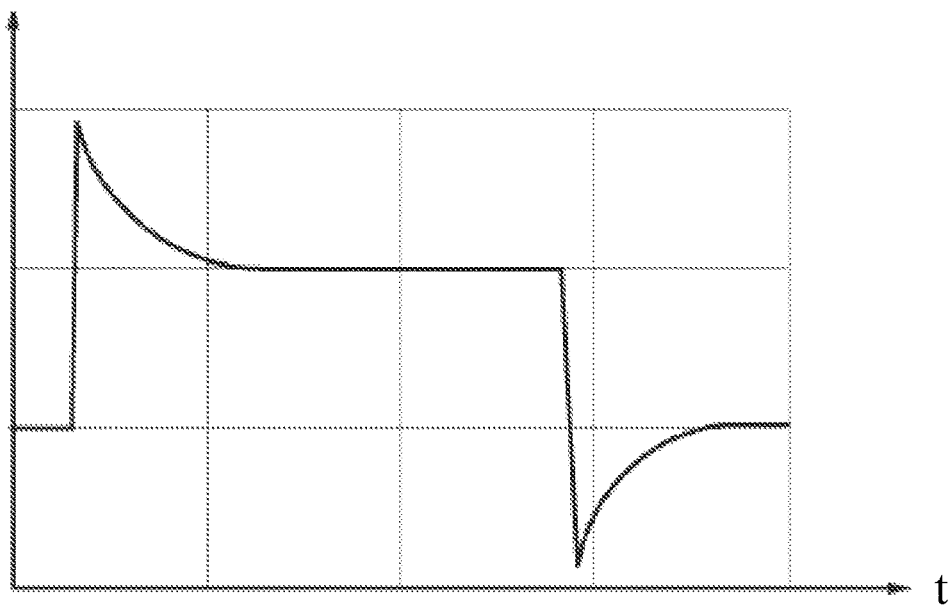
FIG. 5D illustrates a graph showing voltage of a device under test according to one embodiment of the invention.

Therein, FIG. 5A is a diagram illustrating the time course of a voltage $U_S$, sensed with a first sensing probe, respectively at a first measurement point, and the time course of a voltage $U_{S2}$ sensed with a second sensing probe, respectively at a subsequent second measurement point, wherein the second measurement point is closer to the device under test than the first measurement point. Here, the vertical axis represents the sensed voltage and the horizontal axis represents the time t. As can be seen in FIG. 5A, the voltage curves are almost equal apart from that the time course of the voltage $U_S$, sensed at the first measurement point and the time course of the voltage $U_{S2}$ sensed at the second measurement point are time shifted, wherein this time shift is based on the transit time $T_{12}$ of the electrical pulse between the first measurement point and the second measurement point, and wherein the electrical pulse first reaches the first sensing probe, whereas the part of the electrical pulse that is reflected at the device under test first reaches the second sensing probe. Therefore, the first and second measurement points are to be separated by a distance equal to the velocity of light in the conductor multiplied by $T_{12}$ such that $T_{12}$ as the transit time of the electrical pulse between these different measurement points can be determined.

The voltage curves shown in FIG. 5A respectively result from the electrical pulse, respectively the incident pulse Lin being overlaid by the part of the electrical pulse that is reflected at the device under test, respectively the reflected pulse $U_r$. The incident pulse $U_h$ is shown in the diagram shown in FIG. 5B and the reflected pulse $U_r$ is shown in the diagram shown in FIG. 5C. Further, the incident pulse $U_h$ overlaid by the reflected pulse $U_r$ is illustrated in the diagram shown in FIG. 5D that illustrates the voltage at the device under test. Here, the vertical axis respectively represents the sensed voltage and the horizontal axis respectively represents the time t.

Figure 5E:
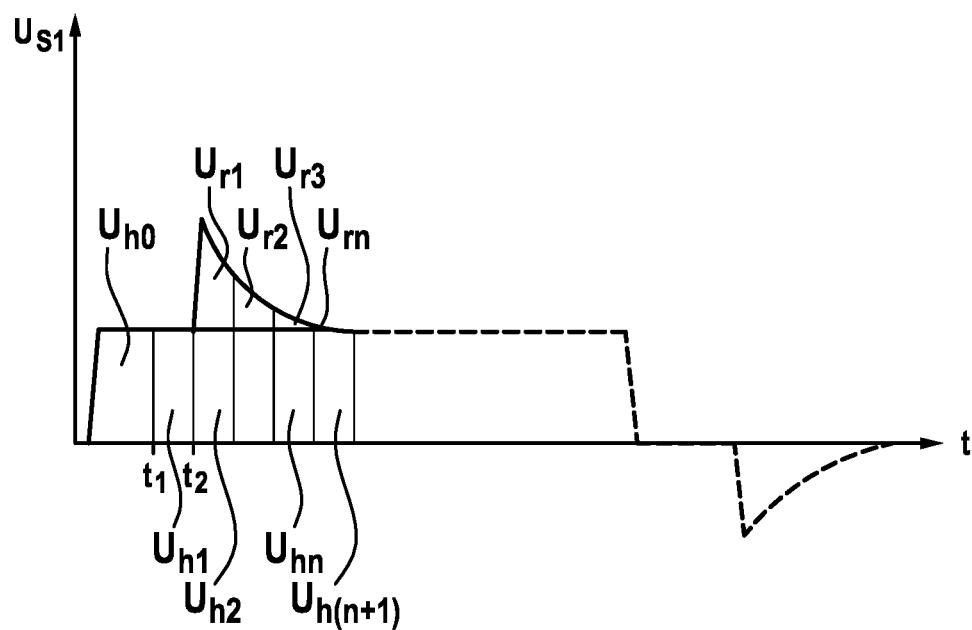
FIG. 5E illustrates a graph showing an exemplary voltage profile of an electrical pulse.
Figure 5F:
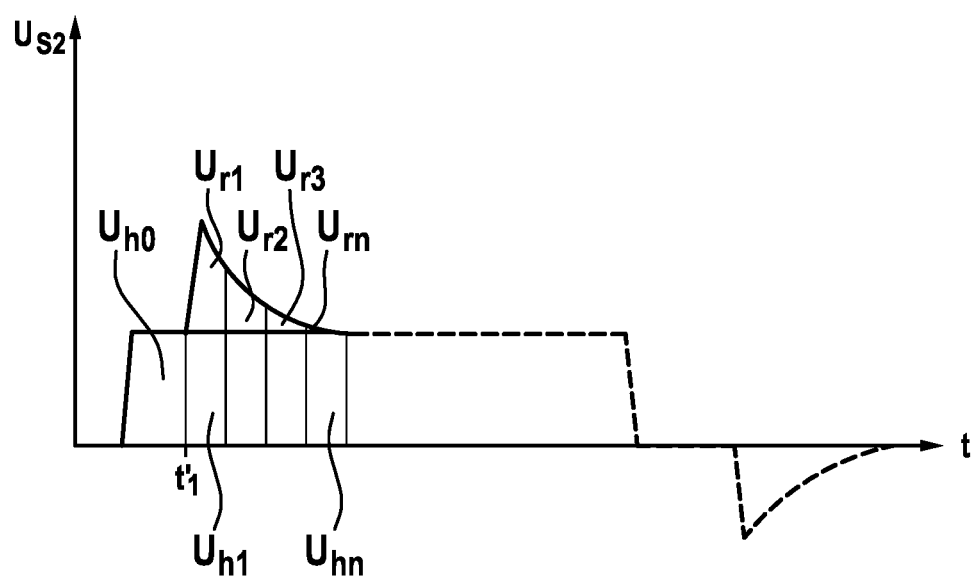
FIG. 5F illustrates a graph showing an exemplary voltage profile of a part of an electrical pulse that is reflected at the device under test.

FIGS. 5E and 5F now describe how a voltage profile of the electrical pulse and a voltage profile of a part of the electrical pulse that is reflected at the device under test are determined. Therein, FIG. 5E is a diagram illustrating the time course of the voltage $U_S$, sensed at the first measurement point and FIG. 5F is a diagram illustrating the time course of the voltage $U_{S2}$ sensed at the subsequent second or last measurement point. Here, the vertical axis respectively represents the sensed voltage and the horizontal axis respectively represents the time t.

As can be again seen in FIGS. 5E and 5F, the time course of the voltage $U_S$, sensed at a first measurement point and the time course of the voltage $U_{S2}$ sensed at the subsequent second or last measurement point are almost equal apart from that the time course of the incoming pulse $U_h$ and the reflected pulse $U_r$ are time shifted in a different way, wherein the difference between these time shifts is based on the transit time of the electrical pulse between the first measurement point and the second measurement point. The second measurement point is located closer to the device under test than the first measurement point. However, as, according to the invention, this transit time between the first measurement point and the second measurement point respectively the second measurement point and the first measurement point is determined and taken into consideration, and as the voltage curves shown in FIGS. 5E and 5F respectively consist of the voltage profile of the incoming electrical pulse and the voltage profile of the part of the electrical pulse that is reflected at the device under test at the corresponding measurement point, the voltage profile of the electrical pulse and the voltage profile of the part of the electrical pulse that is reflected at the device under test can be determined based on the signals generated by the two sensing probes, and a transit time of the pulse between the two measurement points.

For example, the incoming voltage profile of the electrical pulse $U_h$ and the voltage profile of the part of the electrical pulse that is reflected at the device under test $U_r$ can respectively be determined in time segments as shown in FIG. 5E and FIG. 5F. Therein, a first segment $U_{h0}$ of the signal $U_{S2}$ shown in FIG. 5F only consists of the incoming pulse $U_h$ and is identical to the respective first segment of the signal $U_{S1}$ that is also indicated as $U_{h0}$ in FIG. 5E. The next segment $U_{h1}$ of signal $U_{S1}$ shown in FIG. 5E, starting at time $t_1$, still only consists of the incident pulse $U_h$. The respective segment of the signal $U_{S2}$, which is following $U_{h0}$ and starts at $t_1'$ as shown in FIG. 5F, results from the sum of the segment $U_{h1}$ of the incoming pulse and the first segment $U_{r1}$ of the reflected pulse $U_r$. Thus, the first segment $U_{r1}$ of the reflected pulse in the time segment starting at time $t_1'$ can be computed by subtracting $U_{h1}$ from $U_{S2}$, as shown in FIG. 5F.

After $U_{r1}$ has been determined in this way, the next sector $U_{h1}$ of the incoming pulse in the time segment starting with t 2 can be calculated by subtracting $U_{r1}$ from $U_{S1}$, as shown in FIG. 5F.

Similarly, for subsequent sectors, $U_{rn}$ can be calculated by subtracting $U_{hn}$ from $U_{S2}$ and subsequent sectors $U_{h(n+1)}$ can be calculated by subtracting $U_{rn}$ from $U_{S1}$, as indicated in FIG. 5E and FIG. 5F, wherein the index n defines the number of the corresponding segment.

Figure 5G:
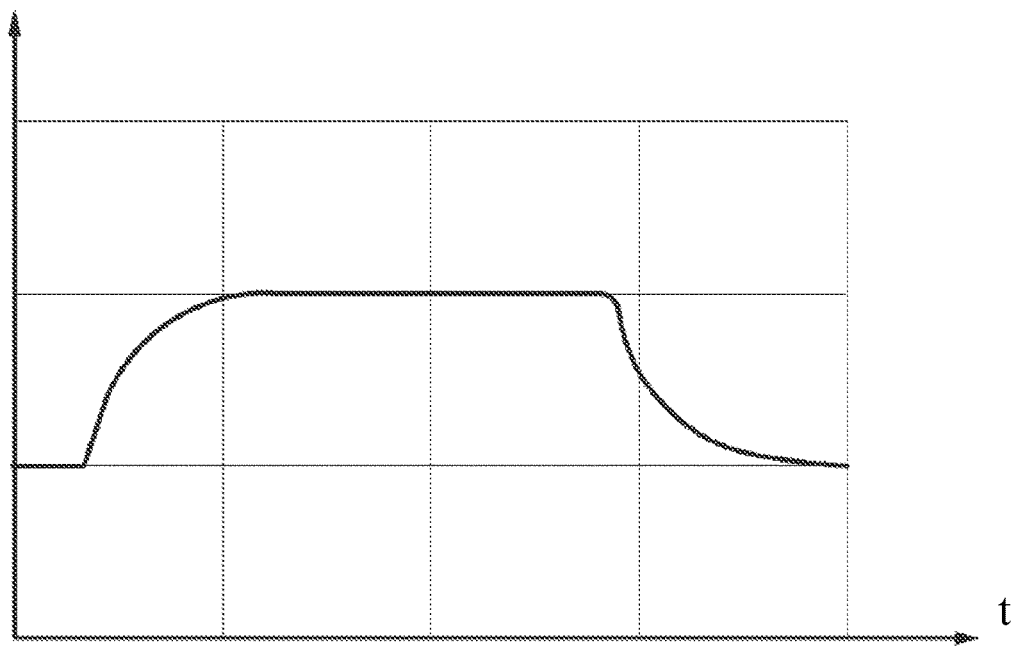
FIG. 5G illustrates a graph showing the determination of a voltage profile of the electrical pulse and a voltage profile of a part of the electrical pulse that is reflected at the device under test according to one embodiment of the invention.

Based on the values thus obtained, the voltage profile of the electrical pulse and the voltage profile of the part of the electrical pulse that is reflected at the device under test can then be reconstructed. Further, a change of a voltage generated at the device under test in response to the electrical pulse over time and a change of a current flowing to the device under test in response to the electrical pulse over time can then be determined based on these reconstructed voltage profiles and the predetermined properties of the conductor, and based on known physical dependencies between these parameters, for example by using equations (9a) and (9b). For example, FIG. 5G is a diagram that illustrates the physical dependence between the current generated at the device under test and the reconstructed voltage profile as well as the predetermined impedance.

A technical feature or several technical features which has/have been disclosed with respect to a singular or several embodiments disclosed herein before, e.g. where a sensing probe positioned at one of at least two measurement points on the conductor is configured to generate a signal in direct proportion to a current flowing in the conductor, may be present also in another embodiment, e.g. where a sensing probe positioned at another one of at least two measurement points on the conductor is configured to generate a signal in direct proportion to a voltage applied to the conductor, except it is/they are specified not to be present or it is impossible for it/them to be present for technical reasons. Thus, while certain exemplary embodiments of the method, process, apparatus, system and methods of making and using the same have been shown and described above, it is to be distinctly understood that the invention is not limited thereto but may be otherwise variously embodied and practiced within the scope of the following claims.

The invention claimed is:

1. An apparatus for determining a response of a device under test to an electrical pulse generated by a pulse generator, comprising:
a conductor for coupling the electrical pulse generator to the device under test, wherein the conductor has a predetermined electrical impedance and a predetermined pulse propagation velocity;
at least two sensing probes connected to the conductor, wherein each of the at least two sensing probes is positioned at one of at least two measurement points on the conductor and is configured to generate a signal in direct proportion to a current flowing in or a voltage applied to the conductor at the corresponding measurement point; and
a determination device configured to determine the response of the device under test to the electrical pulse based on the signals generated by the at least two sensing probes;
and wherein at least two of the at least two sensing probes are positioned at different measurement points of the at least two measurement points, a distance between two of these different measurement points on the conductor is respectively defined in such a way that a transit time of the electrical pulse between these two different measurement points is determinable by the determination device and the determine device is configured to determine the response of the device under test based on the signals generated by the at least two sensing probes and the transit time of the electrical pulse between these different measurement points.

2. The apparatus according to claim 1, wherein each of the at least two sensing probes is configured to generate a signal in direct proportion to the voltage applied to the conductor at the corresponding measurement point.

3. The apparatus according to claim 1, wherein each of the at least two sensing probes is positioned at a separate measurement point and wherein the distance between the two measurement points of the at least two sensing probes is respectively defined in such a way that the transit time of the electrical pulse between the measurement points can be determined via the determination device and the determination device is configured to determine the response of the device under test based on the signals generated by the at least two sensing probes and the transit times of the electrical pulse between the measurement points.

4. The apparatus of claim 1, wherein the determination device is configured to determine a change of a voltage generated at the device under test in response to the electrical pulse over time and/or a change of a current flowing to the device under test in response to the electrical pulse over time.

5. The apparatus according to claim 1, wherein the at least two sensing probes comprises two sensing probes, wherein each of the two sensing probes is configured to generate a signal in direct proportion to the voltage applied to the conductor at the corresponding measurement point, wherein the distance between the corresponding two measurement points is defined in such a way, that a transit time of the electrical pulse between the two measurement points can be determined, and wherein the determination device comprises a mechanism configured to iteratively determine a voltage profile of the electrical pulse and a voltage profile of a part of the electrical pulse that is reflected at the device under test based on the signals generated by the two sensing probes, and the transit time of the pulse between the corresponding measurement points, and a mechanism to determine a change of the voltage generated at the device under test in response to the electrical pulse over time and a change of the current generated at the device under test in response to the electrical pulse over time based on the voltage profile of the electrical pulse, the voltage profile of the part of the electrical pulse that is reflected at the device under test, and the predetermined electrical impedance.

6. The apparatus of claim 1, comprising:
a calibration device configured to calibrate the at least two sensing probes before the response of the device under test is determined.

7. The apparatus of claim 6, wherein the determination device is configured to determine the response of the device under test based on the signals generated by the at least two sensing probes, the transit times of the electrical pulse between these different measurement points and interferences, reflections or attenuation.

8. The apparatus of claim 1, comprising:
at least one attenuator, wherein each of the at least one attenuator is respectively positioned between two of the at least two sensing probes.

9. The apparatus of claim 1, wherein the apparatus is configured to perform Transmission Line Pulse testing of the device under test and/or to perform Very Fast Transmission Line Pulse testing of the device under test.

10. A system for determining a response of a device under test to an electrical pulse generated by a pulse generator, wherein the system comprises a pulse generator to generate the electrical pulse, the device under test, and an apparatus for determining a response of the device under test to an electrical pulse generated by the pulse generator, the apparatus including:

a conductor for coupling the electrical pulse generator to the device under test, wherein the conductor has a predetermined electrical impedance and a predetermined pulse propagation velocity;

at least two sensing probes connected to the conductor, wherein each of the at least two sensing probes is positioned at one of at least two measurement points on the conductor and is configured to generate a signal in direct proportion to a current flowing in or a voltage applied to the conductor at the corresponding measurement point; and a determination device configured to determine the response of the device under test to the electrical pulse based on the signals generated by the at least two sensing probes; and wherein at least two of the at least two sensing probes are positioned at different measurement points of the at least two measurement points, a distance between two of these different measurement points on the conductor is respectively defined in such a way that a transit time of the electrical pulse between these two different measurement points is determinable by the determination device and the determine device is configured to determine the response of the device under test based on the signals generated by the at least two sensing probes and the transit time of the electrical pulse between these different measurement points.

11. A method for determining a response of a device under test to an electrical pulse generated by a pulse generator, comprising:

generating the electrical pulse by the pulse generator;

coupling the electrical pulse generator to the device under test by a conductor, wherein the conductor has a predetermined electrical impedance and a predetermined pulse propagation velocity;

respectively generating a signal that is in direct proportion to a current flowing in or a voltage applied to the conductor by at least two sensing probes connected to the conductor, wherein each of the at least two sensing probes is positioned at one of at least two measurement points on the conductor and is configured to generate an electrical signal in direct proportion to the current flowing in or the voltage applied to the conductor at the corresponding measurement point, and wherein at least two of the at least two sensing probes are positioned at different measurement points of the at least two measurement points, wherein a distance between two of these different measurement points on the conductor is respectively defined in such a way that a transit time of the electrical pulse between these two different measurement points can be determined; and determining the response of the device under test to the electrical pulse based on the signals generated by the sensing probes and the transit times of the electrical pulse between these different measurement points.

12. The method of claim 11, wherein each of the at least two sensing probes is configured to generate a signal in direct proportion to the voltage applied to the conductor at the corresponding measurement point.

13. The method of claim 11, wherein the at least two sensing probes are positioned at successive measurement points and each of the at least two sensing probes is positioned at a separate measurement point, wherein a distance between two successive measurement points is respectively defined in such a way that a transit time of the electrical pulse between the corresponding successive measurement points is determinable, and wherein the response of the device under test to the electrical pulse is determined based on the signals generated by the at least two sensing probes, and the respective transit times of the electrical pulse between successive measurement points.

14. The method of claim 11, wherein the determining of the response of the device under test based on the signals generated by the at least two sensing probes and the transit times of the electrical pulse between these different measurement points comprises:

determining a change of a voltage generated at the device under test in response to the electrical pulse over time and/or a change of a current flowing to the device in response to the electrical pulse over time.

15. The method of claim 14, wherein a signal that is in direct proportion to the voltage applied to the conductor at the corresponding measurement point is respectively generated by two sensing probes, wherein a distance between the corresponding two measurement points is defined in such a way, that a transit time of the electrical pulse between the two measurement points is determinable, and wherein the determining of the response of the device under test to the electrical pulse based on the signals generated by the sensing probes and the transit times of the electrical pulse between these different measurement points includes:

iteratively determining a voltage profile of the electrical pulse and a voltage profile of a part of the electrical pulse that is reflected at the device under test based on the signals generated by the two sensing probes and the transit time of the pulse between the corresponding measurement points; and determining a change of the voltage generated at the device under test in response to the electrical pulse over time and a change of the current generated at the device under test in response to the electrical pulse over time based on the voltage profile of the electrical pulse, the voltage profile of the part of the electrical pulse that is reflected at the device under test, and the predetermined electrical impedance.

16. The method of claim 11, comprising:

calibrating the at least two sensing probes before the response of the device under test is determined.

17. The method of claim 10, wherein the determining of the response of the device under test based on the signals generated by the at least two sensing probes comprises determining the response of the device under test based on the signals generated by the at least two sensing probes, the transit times of the electrical pulse between these different measurement points and interferences, reflections or attenuation.

18. A non-transitory computer readable medium having code stored in the computer readable medium, the code being executable by a processor, the executable code defining a method that is performed by an apparatus having the processor when the processor runs the code, the method comprising:

instructing a pulse generator to generate an electrical pulse, wherein the electrical pulse is coupled to a device under test by a conductor, wherein the conductor has a predetermined electrical impedance and a predetermined pulse propagation velocity;

instructing at least two sensing probes connected to the conductor to generate a signal that is in direct proportion to a current flowing in or a voltage applied to the conductor, wherein each of the at least two sensing probes is positioned at one of at least two measurement points on the conductor and is configured to generate an electrical signal in direct proportion to the current flowing in or the voltage applied to the conductor at the corresponding measurement point, and wherein at least two of the at least two sensing probes are positioned at different measurement points of the at least two measurement points, wherein a distance between two of these different measurement points on the conductor is respectively defined in such a way that a transit time of the electrical pulse between these two different measurement points is determinable and determining the response of the device under test to the electrical pulse based on the signals generated by the at least two sensing probes and the transit times of the electrical pulse between these different measurement points.

* * * * *